United States Patent
Grivna et al.

(10) Patent No.: US 9,331,065 B2
(45) Date of Patent: May 3, 2016

(54) SEMICONDUCTOR DIODE AND METHOD OF MANUFACTURE

(71) Applicant: Semiconductor Components Industries, LLC, Phoenix, AZ (US)

(72) Inventors: Gordon M. Grivna, Mesa, AZ (US); Jefferson W. Hall, Chandler, AZ (US); Mohammed Tanvir Quddus, Chandler, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/803,365

(22) Filed: Jul. 20, 2015

(65) Prior Publication Data

US 2015/0325567 A1 Nov. 12, 2015

Related U.S. Application Data

(60) Continuation-in-part of application No. 14/331,503, filed on Jul. 15, 2014, now Pat. No. 9,117,936, which is a continuation of application No. 13/931,017, filed on Jun. 28, 2013, now Pat. No. 8,815,682, which is a division of application No. 13/109,906, filed on May 17, 2011, now Pat. No. 8,502,336.

(51) Int. Cl.

| | |
|---|---|
| *H01L 29/06* | (2006.01) |
| *H01L 27/02* | (2006.01) |
| *H01L 29/78* | (2006.01) |
| *H01L 29/10* | (2006.01) |
| *H01L 29/423* | (2006.01) |
| *H01L 29/66* | (2006.01) |
| *H01L 21/762* | (2006.01) |

(Continued)

(52) U.S. Cl.
CPC ...... *H01L 27/0255* (2013.01); *H01L 21/76224* (2013.01); *H01L 27/0629* (2013.01); *H01L 29/0619* (2013.01); *H01L 29/105* (2013.01); *H01L 29/1037* (2013.01); *H01L 29/1045* (2013.01); *H01L 29/402* (2013.01); *H01L 29/42364* (2013.01); *H01L 29/66143* (2013.01); *H01L 29/7806* (2013.01); *H01L 29/8725* (2013.01); *H01L 29/0623* (2013.01)

(58) Field of Classification Search
CPC .............. H01L 29/872; H01L 27/0629; H01L 27/0623; H01L 29/8725
See application file for complete search history.

(56) References Cited

U.S. PATENT DOCUMENTS

| | | |
|---|---|---|
| 4,566,172 A | 1/1986 | Bencyua et al. |
| 4,941,026 A | 7/1990 | Temple |

(Continued)

*Primary Examiner* — Tran Tran
(74) *Attorney, Agent, or Firm* — Kevin B. Jackson

(57) ABSTRACT

A diode (200) is disclosed having improved efficiency, smaller form factor, and reduced reverse biased leakage current. Schottky diodes (212) are formed on the sidewalls (210) of a mesa region (206). The mesa region (206) is a cathode of the Schottky diode (212). The current path through the mesa region (206) has a lateral and a vertical current path. The diode (200) further comprises a MOS structure (214), p-type regions (220), MOS structures (230), and p-type regions (232). MOS structure (214) with the p-type regions (220) pinch-off the lateral current path under reverse bias conditions. P-type regions (220), MOS structures (230), and p-type regions (232) each pinch-off the vertical current path under reverse bias conditions. MOS structure (214) and MOS structures (230) reduce resistance of the lateral and vertical current path under forward bias conditions. The mesa region (206) can have a uniform or non-uniform doping concentration.

20 Claims, 5 Drawing Sheets

(51) Int. Cl.
*H01L 27/06* (2006.01)
*H01L 29/872* (2006.01)
*H01L 29/40* (2006.01)

(56) References Cited

U.S. PATENT DOCUMENTS

| | | |
|---|---|---|
| 4,982,260 A | 1/1991 | Chang et al. |
| 5,365,102 A | 11/1994 | Mehrotra et al. |
| 5,612,567 A | 3/1997 | Baliga |
| 6,078,090 A | 6/2000 | Williams et al. |
| 6,252,288 B1 | 6/2001 | Chang |
| 6,498,367 B1 | 12/2002 | Chang et al. |
| 6,537,921 B2 | 3/2003 | Metzler |
| 7,045,397 B1 | 5/2006 | Yu et al. |
| 7,696,540 B2 | 4/2010 | Francis et al. |
| 7,737,522 B2 | 6/2010 | Lui et al. |
| 7,855,384 B2 * | 12/2010 | Yamamoto .......... H01L 29/0843 257/183 |

* cited by examiner

SEMICONDUCTOR DIODE AND METHOD OF MANUFACTURE

CROSS-REFERENCE TO RELATED APPLICATIONS

The present application is a continuation-in-part application of U.S. patent application Ser. No. 14/331,503, filed on Jul. 15, 2014 and issued as U.S. Pat. No. 9,117,936 on Aug. 25, 2015, which was a continuation application of prior U.S. patent application Ser. No. 13/931,017, filed on Jun. 28, 2013 and issued as U.S. Pat. No. 8,815,682 on Aug. 26, 2014, which was a divisional application of prior U.S. patent application Ser. No. 13/109,906, filed on May 17, 2011, and issued as U.S. Pat. No. 8,502,336 on Aug. 6, 2013, which are hereby incorporated by reference, and priority thereto is hereby claimed.

BACKGROUND

This present invention relates, in general, to electronics, and more particularly, to semiconductor device structure and methods of forming the device structure. Diodes are a common type of semiconductor component that are used in both discrete and integrated forms. Semiconductor diodes conduct current when a positive voltage is applied from an anode to a cathode of the device. Conversely, diodes are non-conductive when a negative voltage is applied from the anode to the cathode. A common application for a diode is to rectify a signal. In particular, a diode is often used in the secondary side of switching power supplies. In this application, the diode is in the main power supply path coupled for delivering power to a load. Thus, the rectifying diode can conduct substantial currents when coupled to the load and storage device under regulation. The rectifying diode has a second function. The diode prevents current conduction from the load when the secondary winding of the transformer reverses polarity. The difference between the load voltage and secondary winding voltage can be substantial depending on the application.

The rectifying diode affects power supply efficiency. The principal loss is associated with the forward voltage drop of the rectifier diode during the conducting portion of a switching power supply operating cycle. The trade-off for increasing the size of the rectifying diode to reduce the forward voltage drop is to raise switching and leakage losses. Utilizing a Schottky diode as the rectifying diode lowers the forward voltage drop thereby improving operating efficiency. It is also important that the leakage current under reverse bias conditions be maintained or reduced when compared to other competing technologies. A high leakage current degrades operating efficiency thereby reducing the advantage of the low forward voltage drop of the Schottky diode.

Accordingly, it would be advantageous to have a diode having reduced leakage current under reverse bias conditions and a low forward voltage drop under forward bias conditions. The advantages could be used to optimize device operating efficiency, form factor, or both. It would be of further advantage if the method of manufacture of the device reduces complexity, time, and cost to produce the diode.

BRIEF DESCRIPTION OF THE DRAWINGS

Embodiments of present invention will become more fully understood from the detailed description and the accompanying drawings, wherein.

DETAILED DESCRIPTION

Figure 1:
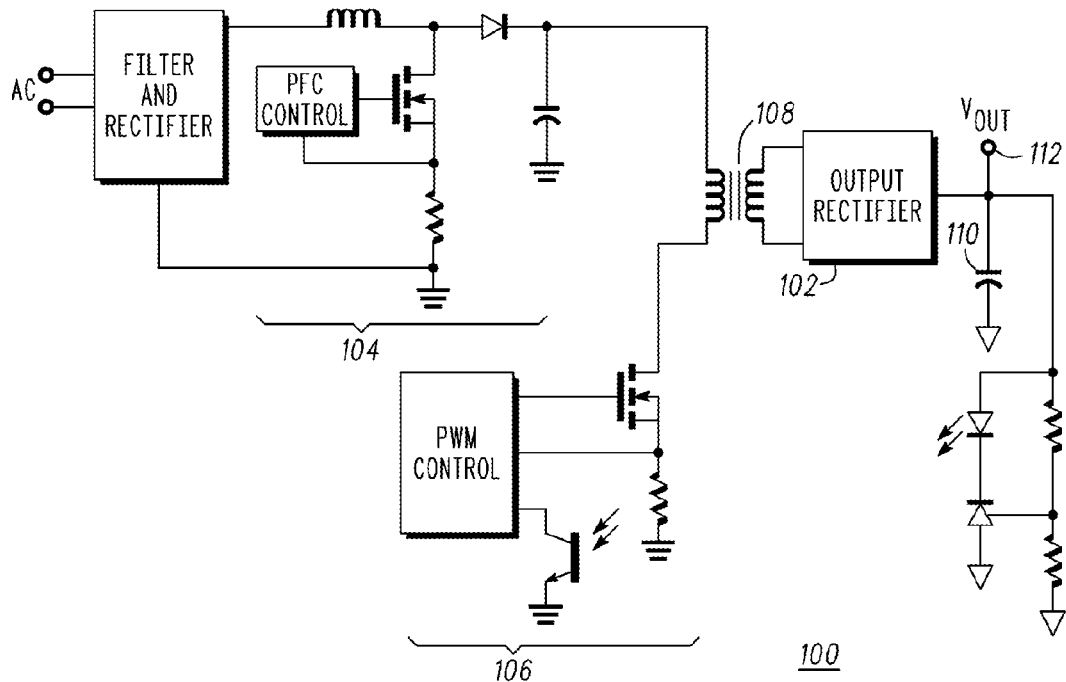
FIG. 1 illustrates a switching power supply having an output rectifier in accordance with an example embodiment.

The following description of embodiment(s) is merely illustrative in nature and is in no way intended to limit the invention, its application, or uses.

For simplicity and clarity of the illustration(s), elements in the figures are not necessarily to scale, are only schematic and are non-limiting, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices may be explained herein as certain N-channel or P-Channel devices, or certain N-type or P-type doped regions, a person of ordinary skill in the art will appreciate that complementary devices are also possible.

It will be appreciated by those skilled in the art that the words "during", "while", and "when" as used herein relating to circuit operation are not exact terms that mean an action takes place instantly upon an initiating action but that there may be some small but reasonable delay, such as a propagation delay, between the reaction that is initiated by the initial action. Additionally, the term "while" means that a certain action occurs at least within some portion of a duration of the initiating action. The use of the word "approximately" or "substantially" means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and inactive means an inactive state of the signal. The actual voltage value or logic state (such as a "1" or a "0") of the signal depends on whether positive or negative logic is used. Thus, "asserted" can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

Processes, techniques, apparatus, and materials as known by one of ordinary skill in the art may not be discussed in detail but are intended to be part of the enabling description where appropriate. For example specific methods of semiconductor doping or etching may not be listed for achieving each of the steps discussed, however one of ordinary skill would be able, without undo experimentation, to establish the steps using the enabling disclosure herein.

Notice that similar reference numerals and letters refer to similar items in the following figures, and thus once an item is defined in one figure, it may not be discussed or further defined in the following figures.

FIG. 1 is an illustration of a switching power supply 100 having an output rectifier 102 in accordance with an exemplary embodiment. Switching power supply 100 is represents a common configuration comprising two stages of control. A first stage is a power factor correction (PFC) stage 104 and a second stage is a pulse width modulating (PWM) stage 106. In general, stages 104 and 106 provide both power factor correction and output voltage regulation of the switching power supply 100 through active adjustments based on detected input and output conditions. In the example, switching power supply 100 couples to an AC voltage, which is rectified, filtered, and provided to the PFC stage 104 as an input voltage. PFC stage 104 generates a regulated voltage that can differ from the output voltage of power supply 100. PFC stage 104 regulates by enabling and disabling a switch. As shown, the switch is a transistor that is controlled by a power factor correction controller circuit that adjusts a duty cycle of the enabled switch in response to a signal corresponding to the regulated output voltage of stage 104. More specifically, power factor correction makes adjustments to maintain an input current having a relationship in time and amplitude with the rectified input voltage provided thereto and with the output current drawn therefrom. The power factor correction circuitry typically keeps the power factor as close to unity as possible.

A second stage of switching power supply 100 is a pulse width modulating (PWM) stage 106. PWM stage 106 receives the regulated output voltage of PFC stage 104 and drives transformer 108 to generate a regulated output voltage that differs from the regulated output voltage from stage 104. PWM stage 106 comprises pulse-width modulating control circuitry, a switch, and a transformer. As shown, the switch is a transistor. The pulse-width modulating control circuitry enables and disables the switch based on an error signal. The error signal corresponds to a difference in the expected regulated output voltage of switching power supply 100 and the voltage Vout at output 112. The voltage Vout at output 112 of switching power supply 100 varies over time due to the load and variations in the load. For example, if the loading on output 112 increases, the PWM stage 106 detects the change and responds by raising the duty cycle to deliver power to the load and maintain or increase the voltage Vout. Conversely, the PWM stage 106 under reduced loading will lower the duty cycle to maintain regulation. In general, the stages 104 and 106 will maintain the voltage at output 112 within a predetermined voltage range dictated by the power supply application.

The regulated output voltage of PFC stage 104 is impressed upon the transformer 108 primary winding by PWM stage 106 in the first portion of a switching cycle. In the second portion of a switching cycle, PWM stage 106 discontinues impression of the regulated PFC output voltage on the transformer primary winding and the transformer secondary winding conducts current through output rectifier 102 to the load. In the example, output rectifier 102 is a rectifier diode having an anode coupled to a secondary transformer winding and a cathode to the output 112. A storage capacitor 110 is coupled to output 112 to provide power to the load when not being delivered by stages 104 and 106. A resistor divider generates a voltage corresponding to the voltage at output 112 that is used to monitor changes. As shown, the changes in voltage across the resistor divider generate an error signal that is coupled optically to the pulse width modulating control circuitry.

The output rectifier 102 has two modes of operation in the switching power supply 100. In a first mode of operation, the output rectifier 102 is in a high current path for driving the load coupled to the output 112 of switching power supply 100. The output rectifier 102 couples PFC stage 104 and PWM stage 106 to the load through transformer 108 when the output rectifier 102 is forward biased. A forward biased condition occurs when the voltage at the anode of output rectifier 102 is greater than the voltage at the cathode. The amount of current handled by output rectifier 102 can be significant depending on the application. For example, output rectifier 102 can conduct amperes to tens of amperes of current for high power switching power supply applications.

In a second mode of operation, output 112 is isolated by output rectifier 102 from PFC stage 104, PWM stage 106, and transformer 108. The isolation is achieved when a voltage at the cathode of output rectifier 102 is greater than a voltage at the anode of output rectifier 102. In general, the output rectifier 102 is reverse biased under this condition and does not conduct current. As mentioned previously, the storage capacitor 110 coupled to the output Vout delivers power to the load in the second mode of operation. The output rectifier 102 can stand off significant voltages while maintaining isolation between the output 112 and the regulation circuitry. For example, the reverse bias voltage across output rectifier 102 can be tens of volts to hundreds of volts depending on the application.

The output rectifier 102 is a contributor to the overall efficiency and cost of the switching power supply 100. In one embodiment, the output rectifier 102 is a diode. More specifically, the output rectifier 102 includes a Schottky diode. In the first mode of operation, the output rectifier 102 can conduct a large current in providing power to the load and charging the storage capacitor coupled to the output Vout. The output rectifier 102 dissipates power while conducting the large currents to the load and storage capacitor. The power loss due to output rectifier 102 corresponds to the forward voltage drop across the output rectifier and the current flowing therethrough. The Schottky diode improves operating efficiency when compared to a silicon p-n diode due to a lower forward voltage drop at a given operating current.

A second factor affecting the efficiency of switching power supply 100 is leakage current from output rectifier 102 under reverse biased conditions. The output rectifier 102 is required to standoff a predetermined voltage without breaking down. Typically, the leakage current will rise as the reverse bias voltage increases. The power loss associated with the leakage current corresponds to the voltage across the output rectifier 102 and the leakage current. Optimization of the output rectifier 102 requires that both the leakage current and the forward voltage drop be taken into account to render an optimal minimum for a power efficient rectifier.

It should be noted that the switching power supply 100 is used to merely illustrate the general operation of output rectifier 102. Furthermore, the description above is an example of how the output rectifier influences the power efficiency of the power supply 100. There are many types of power supplies using secondary side output rectification. High volume commercial applications include low cost flyback circuits, notebook computer power supplies, and ATX power supplies all of which would benefit from an improved output rectifier. Cost and performance are a factor in the selection of the technology used. Often, the initial cost of the supply is chosen over the most efficient solution even though improved efficiency yields a lower cost long term due to reduced energy usage. The rectifier diode disclosed hereinbelow is applicable to all switching power supplies and other diode applications requiring low forward voltage operation, high current capability, low current leakage, and high voltage breakdown.

Disclosed herein is a rectifier diode structure that results in a substantial net performance improvement. As with most device structures, the performance can be traded off to improve one or more specific device parameters. The benefits of the device structure are numerous. The device improves switching times, temperature stability, and provides higher avalanche capabilities when compared to planar Schottky rectifiers and MOSFET rectifiers having the same voltage and current rating. In general, the disclosed Schottky rectifier diode reduces both the forward voltage and leakage current in a trench structure. In one trade-off embodiment, the parameters such as leakage current and forward voltage drop are held constant at a level that is commensurate with the best in class rectifiers. The structure disclosed below is then optimized for silicon area resulting in a 30% reduction in silicon footprint. Thus, the structure can be manufactured at lower cost without sacrificing other performance parameters thereby promoting the proliferation of more efficient power supplies at substantial long-term energy reduction. Alternatively, the structure can be optimized for other performance parameters depending on the needs of the application. Moreover, the performance and cost improvements do not add complexity to the power supply circuitry nor introduce changes in an assembly process. In other words, a performance improvement can be achieved by merely replacing the existing rectifier with the device disclosed hereinbelow allowing rapid retrofitting for lowering cost, improving performance, or both.

Figure 2:
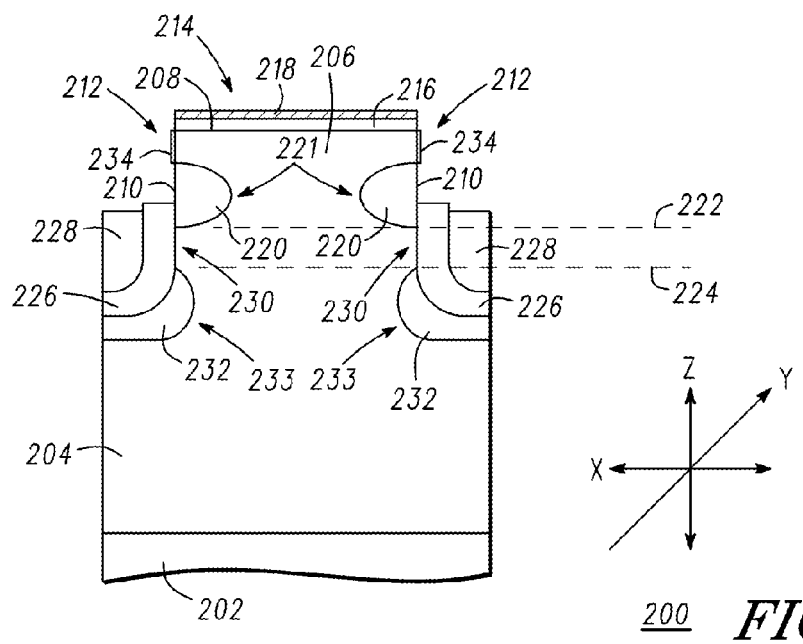
FIG. 2 illustrates a cross-sectional view of a diode in accordance with an example embodiment.

FIG. 2 illustrates a cross-sectional view of a diode 200 in accordance with an example embodiment. In general, a cathode region 204 of diode 200 can be formed in a substrate 202 in regions or layers overlying substrate 202. In the example, diode 200 is formed in a region or layer overlying an n-type substrate 202 having a same conductivity type. As disclosed herein, a description of cathode region 204 being formed in a substrate can include layers overlying the substrate. In one embodiment, n-type substrate 202 is a low resistivity n-type silicon substrate. Cathode region 204 of diode 200 diode is formed in a region or layer having a different resistivity than substrate. More specifically, cathode region 204 is n-type and has a resistivity that is greater than the substrate 202. The resistivity of the cathode region 204 supports the specified breakdown voltage of diode 200. The resistivity of the cathode region 204 can be uniform or non-uniform throughout a conductive path. For example, the cathode region 204 can formed from a single uniformly doped epitaxial layer. Dopant can be added at different depths of the epitaxial layer to change the doping concentration in a predetermined fashion. Alternatively, more than one epitaxial layer may be formed overlying the substrate 202. The different epitaxial layers can have different doping concentrations to optimize performance of the cathode region 204 and devices formed therein while meeting the voltage breakdown specification of diode 200 under reverse biased conditions. As shown, cathode 204 comprises a single epitaxial layer overlying substrate 202.

An n-type mesa region 206 can be formed for diode 200. The mesa region 206 may be formed by a trench etch. The mesa region 206 comprises a major surface 208 and sidewalls 210. The x and z-directions are shown in the cross-section. The y-direction of the diode 200 extends to a predetermined length that corresponds to the device area. For example, the device area can comprise the junction area of diode 200. The device area may be determined by the performance requirements of diode 200 for a specific or general range of applications. In general, more than one mesa region can be formed in cathode region 204 for a high voltage and high current rectifier. Each mesa region can contain a diode having a predetermined device area. The anodes of each diode can be coupled in common by a low resistance interconnect. The cathodes of each diode can share cathode region 204 that can be coupled to the low resistivity substrate 202. In one embodiment, a metal layer can be formed on the exposed major surface of substrate 202 as a cathode contact for diode 200.

In the example, the device structure is described hereinafter in three regions. A first region comprises a portion of diode 200 above horizontal dashed line 222. A second region is the portion of diode 200 below horizontal dashed line 222 and above horizontal dashed line 224. A third region is the portion of diode 200 below horizontal dashed line 224. In general, adjacent regions are merged such that the regions can affect each other but are described separately to illustrate operation of the device. Operation of diode 200 under forward and reverse voltage bias conditions will be discussed in subsequent figures. It should be noted that additional regions using the principals outlined hereinafter may be added to further enhance device performance.

In the first region of diode 200 above dashed line 222, a Schottky diode 212 can be formed in sidewalls 210 of mesa region 206. The Schottky diode 212 is a majority carrier device capable of operating at high speeds. Schottky diode 212 includes a barrier metal 234 as the anode that can be a formed layer on at least a portion of the sidewalls 210 of mesa region 206. The cathode of Schottky diode 212 is the mesa region 206. The anode and cathode of Schottky diode 212 respectively couple to the anode and cathode of diode 200. Schottky diode 212 has a low forward voltage drop to improve power efficiency when used as a rectifying diode for a switching power supply. As shown, the Schottky diode 212 is formed adjacent to the major surface 208 of mesa region 206. The active area of Schottky diode 212 comprises barrier metal 234 coupling to both sidewalls 210 of mesa region 206.

A MOS structure 214 can be formed overlying the major surface of mesa region 206. An insulator layer 216 overlies the major surface of mesa region 206. Insulator layer 216 may be an oxide or other type of insulator. A gate 218 is formed overlying insulator layer 216. In one embodiment, gate 218 may be coupled to the anode of Schottky diode 212. Gate 218 comprises an electrically conductive material such as doped polysilicon, silicided polysilicon, a metal, or a combination thereof. In general, MOS structure 214 forms an enhancement region underlying the major surface 208 of mesa region 206 when diode 200 is forward biased. Conversely, MOS structure 214 forms a depletion region underlying the major surface 208 of mesa region 206 when diode 200 is reverse biased.

P-type regions 220 can be formed in the sidewalls 210 of mesa region 206. In one embodiment, p-type regions 220 can be formed adjacent to Schottky diode 212 a predetermined distance below the major surface 208 of mesa region 206. P-type regions 220 at the predetermined distance below the major surface 208 can bound Schottky diode 212 thereby reducing leakage current of Schottky diode 212. In the illustration, p-type regions are a lower boundary of Schottky diode 212. P-type regions 220 are formed in mesa region 206 and extend a predetermined distance from sidewalls 210. P-type regions 220 and n-type mesa region 206 respectively comprise an anode and cathode of a p-n diode 221. Diode 221 can be coupled in parallel with Schottky diode 212. In the example, the anode and cathode of p-n diode 221 respectively couple to the anode and cathode of diode 200. A first forward biased operating condition of diode 200 corresponds to a majority of the current of diode 200 being conducted by Schottky diode 212. The first operating condition typically occurs under low current and mid current levels of diode 200. The low forward voltage drop of Schottky diode 212 under low and mid current levels prevents diode 221 from conducting significant currents. A second forward biased operating condition of diode 200 corresponds to a condition where Schottky diode 212 and p-n diode 221 conducting current. The second operating condition typically occurs when diode 200 conducts high currents. The forward voltage drop of diode 200 under high currents can forward bias p-n diode 221 for conducting a portion of the total current conducted by diode 200.

MOS structures 230 can be formed overlying sidewalls 210 of mesa region 206 in the second region of diode 200 that resides above dashed line 224 and below dashed line 222. An insulator layer 226 overlies the sidewalls 210 in the second region. Gates 228 are formed overlying insulator layer 226. In one embodiment, gates 228 may be coupled to the anode of Schottky diode 212. Gates 228 comprises a conductive material such as doped polysilicon, silicided polysilicon, a metal, or a combination thereof. In general, MOS structures 230 form an enhancement region adjacent to sidewalls 210 of mesa region 206 when diode 200 is forward biased. Conversely, MOS structures 230 form a depletion region adjacent to sidewalls 210 of mesa region 206 when diode 200 is reverse biased.

In the third region of diode 200 that resides below dashed line 224, p-type regions 232 are formed in sidewalls 210 of mesa region 206 a predetermined distance below the major surface 208 of mesa region 206. P-type regions 232 are formed in mesa region 206 a predetermined distance below major surface 208 of mesa region 206 adjacent to sidewalls 210. A p-n diode 233 is formed comprising p-type regions 232 and n-type mesa region 206. P-type regions 232 and n-type region mesa region 206 are respectively an anode and cathode of p-n diode 233. In one embodiment, p-type regions 232 are not coupled to a voltage potential thereby the anode of p-n diode 233 can float. The p-type regions 232 can also underlie the major surface of the trenches adjacent to sidewalls 210. The diode 233 may not be forward biased for conducting current when diode 200 is forward biased. The floating p-type regions 232 generate space charge regions that affect a current path in mesa region 206 when diode 200 is reverse biased. Alternatively, p-type regions 232 can be coupled to the anode of Schottky diode 212.

Figure 3:
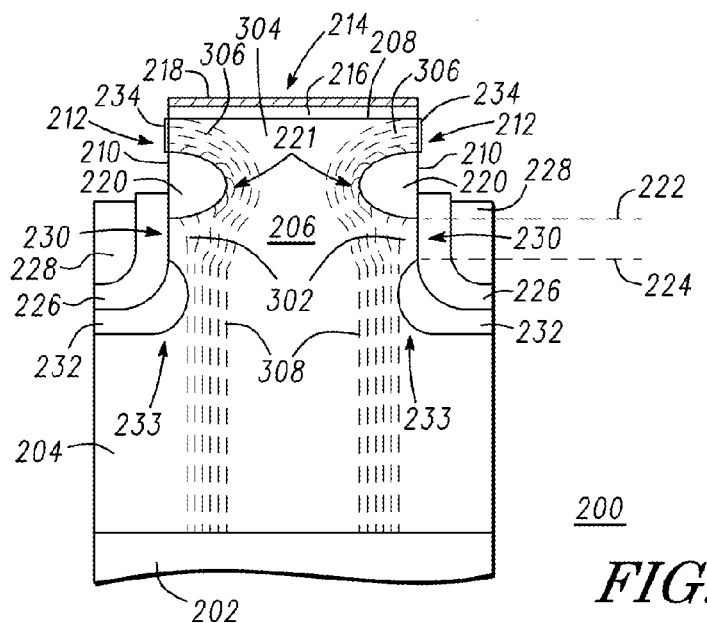
FIG. 3 illustrates a cross-sectional view showing current flow of the diode under forward biased conditions in accordance with an example embodiment.

FIG. 3 illustrates a cross-sectional view showing current flow of the diode 200 under forward biased conditions in accordance with an example embodiment. Diode 200 comprises Schottky diodes 212 and the p-n diodes 221 in parallel. As disclosed above, Schottky diodes 212 comprise barrier metal 234 and mesa region 206. Diodes 221 comprise p-type regions 220 and mesa region 206. In general, diode 200 conducts a current that couples through mesa region 206 to substrate 202 when forward biased. The current path is both lateral and vertical in mesa region 206. The forward bias current from diode 200 comprises current from Schottky diode 212 and p-n diodes 221. The initial current path from diode 200 flows laterally into mesa region 206. A lateral current path 306 corresponds to current flowing approximately parallel to major surface 208 of the mesa region 206 from Schottky diodes 212. Similarly, a portion of the current conducted by p-n diodes 221 will flow laterally into the mesa region 206. The current path of diode 200 changes from a lateral current path to a vertical current path 308 for a majority of the current path through mesa region 206 to substrate 202. Vertical current path 308 corresponds to current flow approximately parallel to sidewalls 210 of mesa region 206.

Ideally, to maximize power efficiency of diode 200 both the forward voltage drop across diode 200 and the resistance of the current path is minimized. In one embodiment, diode 200 includes Schottky diodes 212 to minimize the forward voltage drop when conducting current. The amount of forward voltage drop can be scaled by adjusting the total active area of diode 200 that comprises Schottky diodes 212 and p-n diodes 221. In one embodiment, the current of diode 200 at low to medium current levels may be principally carried by Schottky diodes 212. At high current levels, the current can be shared between Schottky diodes 212 and p-n diodes 221 in parallel. Trade-offs exist, for example at some point increasing the active area of diodes 212 and 221 may have diminishing returns in device efficiency as other factors such as switching losses can reduce the benefit as the device size is increased.

In general, MOS structures 214 and 230 further enhance the performance of diode 200 under forward biased conditions by effectively lowering the resistivity of mesa region 206. The gates of MOS structures 214 and 230 are coupled to the anode of diode 200. In the example, a positive anode voltage of diode 200 is applied to the gates 218 and 228 respectively of MOS structures 214 and 230. Enhancement regions can be formed in mesa region 206 by MOS structures 214 and 230. The active method of reducing the resistivity of the current path of diode 200 in mesa region 206 has the further benefit of having little or no effect on the breakdown characteristics of diode 200 under reverse biased conditions.

More specifically, MOS structure 214 overlies major surface 208 of mesa region 206. An enhancement region 304 is formed underlying insulator layer 216 in mesa region 206 under forward biased conditions of diode 200. Enhancement region 304 has a lower resistivity than the adjacent areas of mesa region 206. Current from diode 200 takes a path of least resistance while in lateral current path 306. Thus, the resistive path is lowered for current being conducting laterally from sidewalls 210 of mesa region 206 by Schottky diodes 212 and p-n diodes 221.

MOS structures 230 are a predetermined distance below the major surface 208 of mesa region 206. In one embodiment, MOS structures 230 are between p-type regions 220 and p-type regions 232 adjacent to sidewalls 210 of mesa region 206. A positive voltage is applied to gates 228 when diode 200 is forward biased. An enhancement region 302 can be formed adjacent to insulator layer 226 along the sidewalls 210 of mesa region 206 when diode 200 is forward biased. Enhancement region 302 has a lower resistivity than the adjacent areas within mesa region 206. Current from diode 200 takes this path of least resistance while in the vertical current path 308. Thus, the resistive path is lowered for current being conducting vertically within mesa region 206 by MOS structures 230. The current path can spread out within mesa region 206 and in the cathode region 204 thereby further reducing the current density per unit area.

Figure 4:
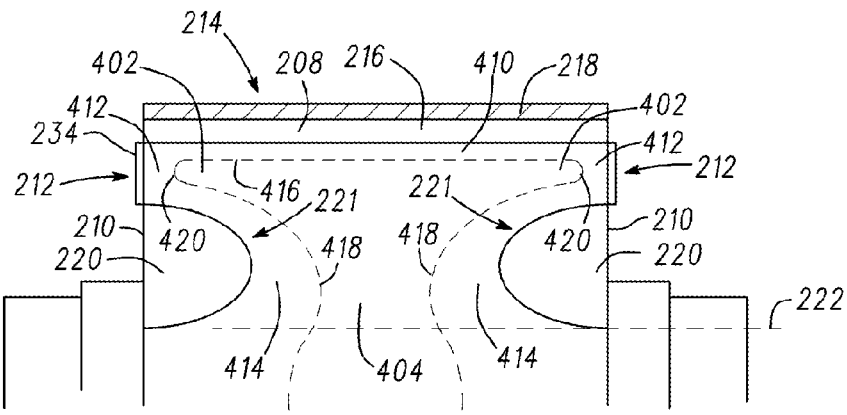
FIG. 4 illustrates a cross-sectional view of a first pinch-off region and a second pinch-off region when the diode is reverse biased in accordance with an example embodiment.

FIG. 4 illustrates a cross-sectional view of a pinch-off region 402 and a pinch-off region 404 when the diode 200 is reverse biased in accordance with an example embodiment. Diode 200 can be designed to breakdown above a predetermined voltage. Operation of diode 200 is typically maintained below the specified breakdown voltage of the device. The improved leakage current characteristic of diode 200 under reverse biased conditions is a contributor to diode 200 being power efficient and having a smaller silicon footprint. The structure of diode 200 reduces or maintains a low leakage current level over a non-breakdown reverse bias voltage range of the device. In general, multiple structures are placed in mesa region 206 that restrict the current path of diode 200 under reverse biased conditions to reduce leakage current. In the example, the multiple structures comprise MOS structures 214 and 230, and diodes 212, 221, and 233. Moreover, the current path becomes more restricted as the reverse bias voltage increases thereby lowering or reversing a rate of change in leakage current as diode 200 approaches breakdown. The multiple structures formed in mesa region 206 allow the performance to be improved in both forward and reverse biased conditions. More specifically, the individual structures can be tailored to optimize performance of diode 200 over specific operating ranges or conditions.

In the example disclosed herein, the regions of diode 200 defined by dashed lines 222 and 224 each contribute to reducing leakage current. MOS structure 214, Schottky diode 212, and diode 221 formed in mesa region 206 are shown in the illustration. Leakage current can be reduced by actively modifying the current path when diode 200 is reverse biased. In addition, p-type regions 220 provide leakage current reduction by being formed adjacent to and bounding Schottky diodes 212. In one embodiment, leakage current is reduced by constriction or pinching-off the current path through mesa region 206. The pinched-off current path in mesa region 206 is reduced by space charge or depletion regions of MOS structure 214, Schottky diode 212, and diode 221. Typically, the volume occupied by the space charge or depletion region increases with reverse bias voltage of diode 200 thereby restricting the lateral and vertical current path. This corresponds well with diode 200 simulated characteristics where the rate of change of diode 200 leakage current is reduced with respect to prior art diodes thereby providing a lower low leakage current over an entire reverse bias operating range of the device.

Similar to diode 200 under forward biased conditions, leakage current is conducted in both lateral and vertical paths within mesa region 206 under reverse biased conditions. As disclosed above, the leakage current of diode 200 can be reduced by restricting the area of the lateral and vertical current path by depletion or space charge regions generated by MOS structure 214, Schottky diodes 212, and p-n diodes 221 when diode 200 is reverse biased. A depletion region 410 that supports the pinch-off region 402 of a lateral leakage current path under reverse biased condition of diode 200 is produced by MOS structure 214. As mentioned previously, gate 218 of MOS structure 214 is coupled to the anode of diode 200. The reverse bias voltage applied to gate 218 of MOS structure 214 depletes mesa region 206 underlying insulator layer 216 forming depletion region 410. The depletion region 410 and pinch-off region 402 of the lateral current path is bounded by dashed line 416. A restriction of pinch-off regions 402 can be produced by Schottky diodes 212 when diode 200 is reverse biased. Schottky diodes 212 form space charge regions 412 in mesa region 206 that supports the pinch-off regions 402 when reverse biased thereby restricting the lateral current path. Dashed line 420 bounds space charge regions 412 and pinch-off regions 402. Finally, a space charge region 414 that supports further restriction of pinch-off region 402 of the lateral current path is generated by the p-n diodes 221. Diodes 221 are coupled in parallel with the Schottky diode 212. The space charge regions 414 are bounded from pinch-off region 402 by dashed line 418. The portion of space charge region 414 of diode 221 in proximity to major surface 208 of mesa region 206 restricts pinch-off region 402 of the lateral current path. Thus, three space charge or depletion regions 410, 412, and 414 under reverse bias conditions of diode 200 reduce the lateral current path as indicated by pinched-off regions 402 thereby reducing the leakage current of diode 200. The pinch-off of the lateral current path increases with rising reverse bias voltage across diode 200 to reduce the rate of change of leakage current with reverse bias voltage.

In general, a vertical leakage current path in mesa region 206 under both forward biased and reverse biased conditions are restricted by diodes 221. P-type regions 220 of diode 221 form a neck within mesa region 206. The vertical current path is further restricted when diode 200 is reverse biased by the space charge regions 414 generated by diodes 221. The space charge regions 414 of diode 221 change the vertical conductive path similar to a Junction Field Effect Transistor (J-FET). The conductive path of a J-FET is controlled by the amount of reverse-bias on p-n junctions adjacent to a J-FET channel. More specifically, increasing or decreasing the space charge region of a J-FET respectively decreases or increases the cross-sectional area of the conductive channel. Similarly, p-n diodes 221 form a pinch-off region 404 that is between the space charge regions 414 of diode 221 thereby reducing the area of the vertical current path. A portion of space charge regions 414 and pinch-off region 404 is bounded by dashed line 418. The reduction or restriction of the vertical current path through mesa region 206 by the space charge regions of p-n diodes 221 further reduces leakage current when diode 200 is reverse biased.

Figure 5:
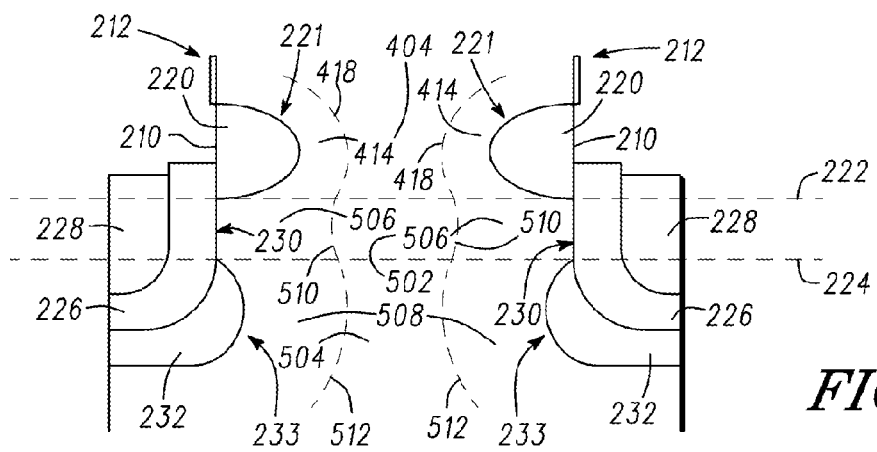
FIG. 5 illustrates a cross-sectional view of a third pinch off region and a fourth pinch-off region when the diode is reverse biased in accordance with an example embodiment.

FIG. 5 illustrates a cross-sectional view of a pinch-off region 502 and a pinch-off region 504 when the diode 200 is reverse biased in accordance with an example embodiment. The pinch-off regions 502 and 504 further reduce leakage current by restricting the vertical leakage current path through mesa region 206 at different depths therein. MOS structures 230 and p-n diodes 233 respectively generate the pinch-off regions 502 and 504 in a vertical current path of mesa region 206 under reverse bias conditions of diode 200. The MOS structures 230 are at a predetermined distance from the major surface 208 of mesa region 206. In one embodiment, MOS structures 230 are formed on a portion of sidewalls 210 below p-type regions 220 and above p-type regions 232. Diodes 233 are formed below MOS structures 230 in mesa region 206. A reverse bias voltage applied to the anode of diode 200 is coupled to gates 228 of MOS structures 230 thereby forming depletion regions 506 adjacent to sidewalls 210 that restrict the vertical current path. Pinch-off region 502 is the portion of the vertical current path through mesa region 206 that is restricted by depletion regions 506. The amount of depletion generated by MOS structures 230 corresponds to the doping density of mesa region 206 and the voltage applied to the gate of MOS structures 230. The depletion regions 506 and pinch-off region 502 is bounded by dashed line 510. The dashed lines 510 are below horizontal dashed line 222 and above horizontal dashed line 224.

The vertical current path through mesa region 206 can be further restricted by diodes 233 forming pinch-off region 504. In the example, p-n diodes 233 comprise p-type regions 232 and n-type mesa region 206. In one embodiment, the anodes of diodes 233 float and are not coupled to a voltage potential. Pinch-off region 504 is between the space charge regions 508 of diodes 233. The space charge regions 508 and pinch-off region 504 is bounded by dashed lines 512. The dashed lines 512 are below the horizontal dashed line 224. As shown, p-type regions 232 also underlie a major surface of the trenches etched to form mesa region 206. Pinch-off regions 502 and 504 support a reduction of leakage current under reverse bias conditions that restricts the vertical current path as the current path enters into cathode 204. Below mesa region 206, cathode 204 continues for a predetermined distance until it couples to low resistivity substrate 202. In cathode 204, the current path is not restricted below mesa region 206 and the current can spread as it approaches substrate 202.

Although disclosed as separate pinch-off regions, the proximity of regions 402, 404, 502, and 504 can interact with one another. More specifically, adjacent pinch-off regions can affect or modify the amount of restriction that occurs. Simulations of diode 200 can determine the amount of interaction and the effect thereof. Another factor in the interaction of the pinch-off regions can be the doping concentration within mesa region 206. As mentioned previously, mesa region 206 can have uniform doping or non-uniform doping. For example, ion implants can be used to modify doping of mesa region 206 through the major surface 208 and/or sidewalls 210. In one embodiment, cathode 204 of diode 200 comprises an epitaxial layer formed overlying substrate 202. Mesa region 206 is formed by removing portions of the epitaxial layer whereby trenches are adjacent to sidewall 210. Alternatively, cathode 204 can comprise more than one epitaxial layer. Each epitaxial layer may have a different doping concentration. Mesa region 206 can be formed to extend into two or more epitaxial layers to provide different doping levels at different depths and the corresponding devices formed therein.

In one example, the diode 200 was compared to a prior-art rectifying diode having a breakdown voltage of approximately 100 volts. Diode 200 had a substantial reduction in leakage current for the same breakdown voltage. As mentioned previously, trade-offs can be made to improve other performance characteristics of diode 200 while maintaining low leakage current. For example, the leakage current of diode 200 was maintained at a value equivalent to other prior art diodes while improving other diode characteristics. For example, the lower leakage current of diode 200 can be traded off by lowering the resistivity of cathode 204 until the leakage current is approximately equal to prior art diodes. The lower resistivity resulted in a substantial reduction in forward operating voltage and the corresponding improvement in power efficiency. Alternatively, by holding the leakage current and forward operating voltage similar to the prior art diodes, diode 200 could be reduced in area by 30% resulting in a substantial manufacturing cost reduction.

Figure 6:
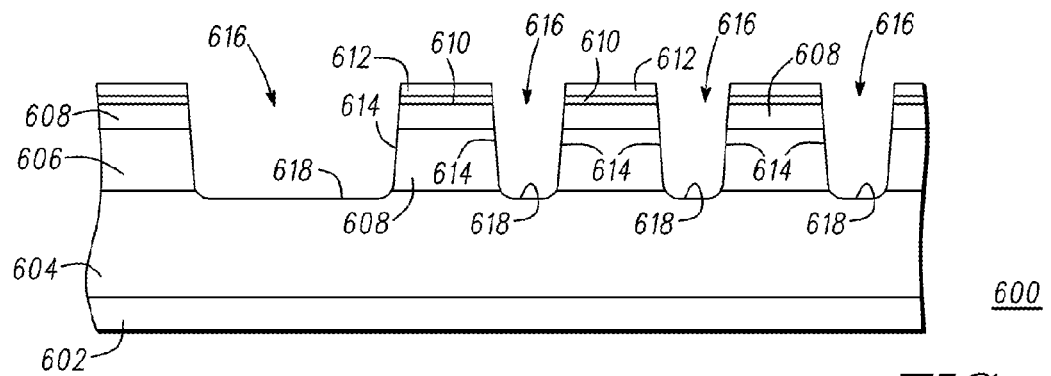
FIG. 6 illustrates a cross-sectional view of trenches formed in accordance with an example embodiment of a diode.

FIGS. 6-11 illustrate at one stage of an example of an embodiment of a method of forming a diode 600. Diode 600 may be similar to embodiments of diode 200. FIG. 6 is a cross-sectional view of trenches formed in accordance with example embodiment of diode 600. The diode 600 can have a reverse bias breakdown voltage exceeding a hundred volts while carrying amperes of current or tens of amperes of current when forward biased in a rectifier application. Disclosed herein is an example of diode 600 having a hundred voltage breakdown to illustrate the method. In general, the specific doping concentrations, resistivities, physical parameters, and characteristics disclosed herein support the 100 volt breakdown example. In one embodiment, a starting material comprises a substrate 602 and epitaxial layers 604, 606, and 608. Substrate 602 is a low-resistivity n-type substrate. In the example, silicon substrate 602 comprises 0.003 ohm-centimeter material having an n-type doping concentration of approximately $2.0\,e^{19}/cm^3$. The epitaxial layers 604, 606, and 608 are n-type epitaxial layers each having different resistivities. The epitaxial layers 604, 606, and 608 and the doping concentrations thereof support the breakdown voltage of diode 600. In the example, epitaxial layer 604 comprises an n-type layer of approximately 6.5-8.0 microns in depth. Epitaxial layer 604 has an n-type doping concentration range of approximately $(2.5\text{-}4.5)e^{15}/cm^3$. Epitaxial layer 606 overlies epitaxial layer 604. Epitaxial layer 606 comprises an n-type layer of approximately 0.6-1.6 microns in depth. Epitaxial layer 606 has an n-type doping concentration of approximately $1.0\text{-}2.0\,e^{15}/cm^3$. Epitaxial layer 608 overlies epitaxial layer 606. Epitaxial layer 608 comprises an n-type layer of approximately 0.5-1.0 microns in depth. Epitaxial layer 608 has an n-type doping concentration of approximately $4.0\,e^{15}/cm^3\text{-}1.0\,e^{16}/cm^3$. Alternatively, a single epitaxial layer can overlie substrate 602 as disclosed for the example diode 200. The single epitaxial layer for a 100 v breakdown has a depth of approximately 7.0 microns. The single epitaxial layer has an n-type doping concentration of approximately $4.7\,e^{15}/cm^3$ or comprises 1.0 ohm-centimeter material.

An insulating layer is formed overlying epitaxial layer 608. In the example, the insulating layer is a pad silicon dioxide layer 610 that is formed overlying a surface of epitaxial layer 608. Silicon dioxide layer 610 can be formed having a thickness of approximately 0.1-0.2 microns. An insulating layer can then formed overlying silicon dioxide layer 610. In the example, the insulating layer can be a silicon nitride layer 612 that is formed overlying pad silicon dioxide layer 610. In one embodiment, silicon nitride layer 612 is formed approximately 2000 angstroms thick. Photoresist is formed overlying silicon nitride layer 612. The photoresist is patterned and exposed such that portions of silicon nitride layer 612 are removed while remaining photoresist protects underlying material. The exposed portions of silicon nitride layer 612 correspond to regions where material may be removed.

The exposed portions of silicon nitride layer 612 are removed exposing silicon dioxide layer 610. Similarly, exposed portions of silicon dioxide layer 610 are removed in non-photoresist protected areas thereby exposing epitaxial layer 608. Trenches 616 are formed by removing material from exposed epitaxial layer 608. In the example, a trench etch may be performed that etches through epitaxial layer 608 and partially into epitaxial layer 606 exposing a major surface 618 in each trench 616. Mesa regions are formed between trenches 616 having sidewalls 614. In one embodiment, the trench etch leaves a slope on sidewalls 614. The photoresist can be removed after trenches 616 have been etched exposing remaining portions of silicon nitride layer 612. As shown, more than one mesa region can be formed by the trench etch. Mesa regions are the remaining portions of epitaxial layers 608 and 606 between trenches 616. In the example of the 100 volt diode, the width of a mesa region between trenches 616 can be approximately 1.5-3.0 microns wide. Trenches can be formed in a range of approximately 1.0 microns to 2.0 microns from the major surface of the mesa regions. The subsequently formed diodes of each mesa region disclosed herein can be coupled in parallel to form one large diode capable of handling high currents with a low forward voltage drop.

Figure 7:
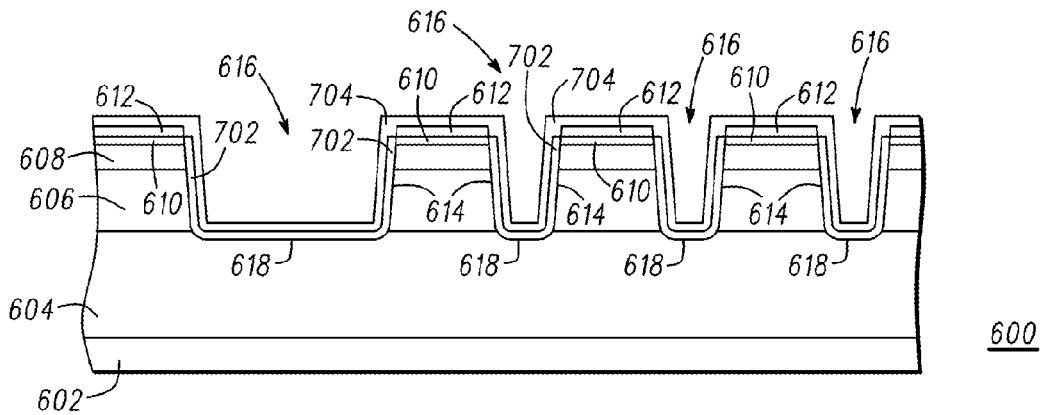
FIG. 7 illustrates the diode at another stage of formation according to an example of the cross-sectional view of the preparation of the sidewalls.

FIG. 7 illustrates diode 600 at another stage of formation according to an example of the cross-sectional view of the preparation of the sidewalls 614. An insulating layer is formed overlying sidewalls 614 and major surface 618 of each trench 616. In the example, a first insulating layer is a silicon dioxide layer (not shown) that is formed on the exposed sidewalls 614 and major surface 618 of each trench 616. In one embodiment, the silicon dioxide layer can be a sacrificial oxide approximately 1000 angstroms thick. The first silicon dioxide layer is then sacrificed or removed thereby leaving the sidewalls 614 and major surface 618 of each trench 616 exposed. An insulating layer can then be formed overlying sidewalls 614 and major surface 618 of each trench 616. In the example, the insulating layer can be a silicon dioxide layer 702. In one embodiment, the silicon dioxide layer 702 can be a trench liner oxide approximately 50 angstroms thick that overlies sidewalls 614 and major surface 618 of each trench 616. An insulating layer can then be formed overlying silicon nitride layer 612 and silicon dioxide layer 702. In the example, the insulating layer can be a silicon nitride layer 704. In one embodiment, the silicon nitride layer 704 is 500 angstroms thick. The silicon nitride layer 704 couples to the silicon nitride layer 612. The combined thickness of silicon nitride layers 704 and 612 overlying the major surface of each mesa region is approximately 2500 angstroms thick. The silicon nitride layer 704 overlies silicon dioxide layer 702 on sidewalls 614 and major surface 618 of each trench 618.

Figure 8:
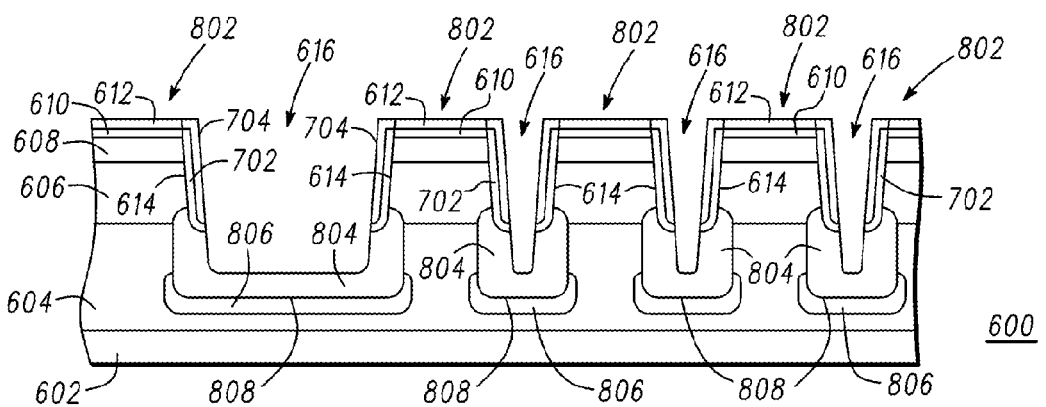
FIG. 8 illustrates the diode at another stage of formation according to an example of the cross-sectional view of the preparation of extending the trenches.

FIG. 8 illustrates diode 600 at another stage of formation according to an example of the cross-sectional view of the preparation of extending trenches 616. The silicon nitride layer 704 can be preferentially removed overlying each mesa region and the major surfaces of each trench 616. In the example, an anisotropic etch can be performed on silicon nitride layer 704 such that silicon nitride is removed overlying major surface 618 of each trench 616 and removed from the insulator stack comprising silicon nitride layer 704 and silicon nitride layer 612. Note that only a portion of the silicon nitride is removed from the combined layers 704 and 612 overlying the mesa regions and thus at least a portion of silicon nitride layer 612 remains. Moreover, a portion of silicon nitride layer 704 overlying silicon dioxide layer 702 on sidewalls 614 remains after the anisotropic etch due to the preferential removal process.

The removal of silicon nitride layer 704 exposes silicon dioxide layer 702 overlying major surface 618 of each trench 616. The exposed silicon dioxide layer 702 can then be removed. In the example, an oxide etch removes exposed silicon dioxide layer 702 thereby exposing major surface 618 of each trench 616. Material can be removed from major surface 618 of epitaxial layer 606. Trenches 616 are extended to an increased depth by removing epitaxial material. In the example, a recess etch can be performed to remove epitaxial material in each trench 616. In one embodiment, the recess etch etches through epitaxial layer 606 and partially into epitaxial layer 604.

An insulating layer (not shown) is then formed on exposed portions of sidewalls 614 and major surface 808 of trenches 616. In the example, the insulating layer comprises silicon dioxide. The silicon dioxide layer formed on the exposed portions of sidewalls 614 and major surface 808 of trenches 616 can be a sacrificial oxide that is subsequently removed. An insulating layer can then be formed on the exposed portions of sidewalls 614 and major surface 808 after removing the sacrificial oxide layer. In the example, the insulating layer can be formed as a silicon dioxide layer 804. In one embodiment, a wet oxidation process can be used to grow silicon dioxide layer 804 having thickness of approximately 1500-3000 angstroms. Mesa regions 802 comprise the epitaxial region 608, epitaxial region 606, and a portion of epitaxial region 604 between trenches 616 and defined by the trench etch and the recessed trench etch disclosed above.

Dopant can be placed underlying silicon dioxide layer 804 that will subsequently form a doped region. In the example, the dopant is p-type. A blanket boron implant can be used to place the p-type dopant. The boron implant penetrates portions of silicon dioxide layer 804 but not areas protected by silicon nitride layers 612 and 704. In general, silicon nitride layer 612 and 704 form a mask to prevent dopant from being placed in sidewalls 614 and below the major surface of mesa region 802 from being doped. The boron implant underlying silicon dioxide layer 804 is then annealed forming p-type regions 806. The p-type regions 806 correspond to p-type regions 232 and diode 233 of diode 200 disclosed herein. P-type regions 806 form p-n junctions with epitaxial layer 604 where the space charge regions of the diodes can pinch-off or restrict the vertical current path through mesa region 802 under reverse bias conditions of diode 600. As disclosed above, mesa regions 802 comprise epitaxial layer 608, epitaxial layer 606, and a portion of epitaxial layer 604 between trenches 616 each having a different doping concentration. Thus, the mesa regions 802 have a non-uniform doping concentration in the embodiment. Furthermore, the doping concentration within each epitaxial layer can be uniform or non-uniform.

In the example of a 100 volt diode, p-type regions 806 are formed in epitaxial layer 604 having a doping concentration of $(2.5-4.5)e^{15}/cm^3$. The anneal process diffuses p-type regions 806 to a depth approximately 0.25-0.3 microns vertically below silicon dioxide layer 804. P-type regions 806 extend approximately 0.2-0.25 microns laterally into epitaxial layer 604 from a boundary of silicon dioxide layer 804 in proximity to mesa region 802.

Figure 9:
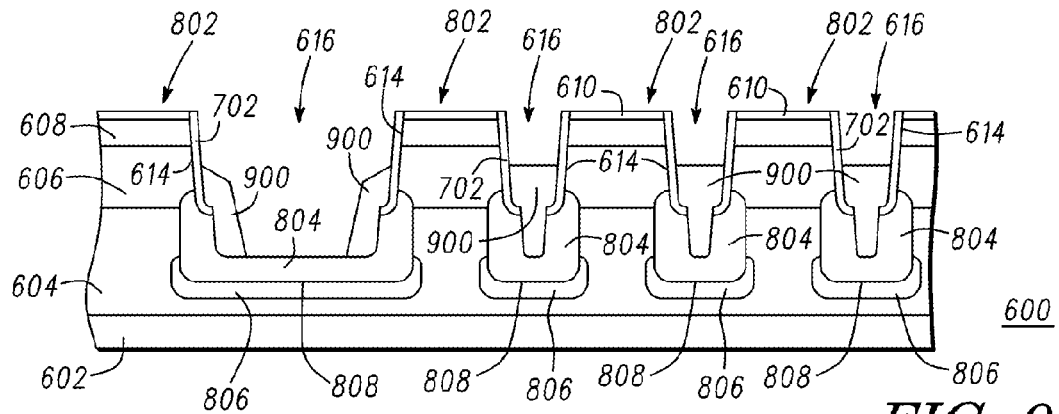
FIG. 9 illustrates the diode at another stage of formation according to an example of the cross-sectional view having partially filled trenches.

FIG. 9 illustrates diode 600 at another stage of formation according to an example of the cross-sectional view having partially filled trenches 616. In general, a selective removal of insulating layers is disclosed followed by a placement of a conductive material in trenches 616. The silicon nitride layers 612 and 704 respectively overlying silicon dioxide layer 610 and silicon dioxide layer 702 are removed. In one embodiment, a wet strip can be used to remove silicon nitride layers 612 and 704. The removal of silicon nitride layers 612 and 704 exposes an underlying insulating layer. In the embodiment, the wet strip exposes silicon dioxide layer 610 and silicon dioxide layer 702. A material is then placed in trenches 616. In the example, the material can be electrically conductive and partially fill trenches 616. In one embodiment, the conductive material can be a layer of polysilicon. The layer of polysilicon overlies silicon dioxide layer 610 and partially fills trenches 616. The layer of polysilicon is subsequently removed overlying silicon dioxide layer 610 whereby polysilicon 900 remains in trenches 616. Polysilicon 900 can be doped polysilicon or doped with a dopant such as boron after being formed. Further material from polysilicon 900 can be removed in a subsequent step. Polysilicon 900 can be formed to a predetermined height below the major surface of mesa regions 802 in the trenches 616. The predetermined height of polysilicon 900 is positioned to form and locate p-type regions adjacent to a portion of sidewalls 614 corresponding to p-type regions 220 of FIG. 2. In one embodiment, the polysilicon 900 can be above silicon dioxide layer 804 overlying sidewalls 614 of mesa regions 802.

In the example of the 100 volt diode, the polysilicon 900 is placed approximately 0.25-0.35 microns above silicon dioxide layer 804. The 0.25-0.35 micron portion of polysilicon 900 above silicon dioxide layer 804 overlies silicon dioxide layer 702. The remaining polysilicon 900 in trenches 616 overlie silicon dioxide layer 804. The major surface of polysilicon 900 is approximately 0.80 microns below the major surface of mesa regions 802. In one embodiment, the portion of polysilicon 900 that overlies silicon dioxide layer 702 can be aligned with epitaxial layer 606 having a doping concentration of $1.0\text{-}2.0\ e^{15}/cm^3$.

Figure 10:
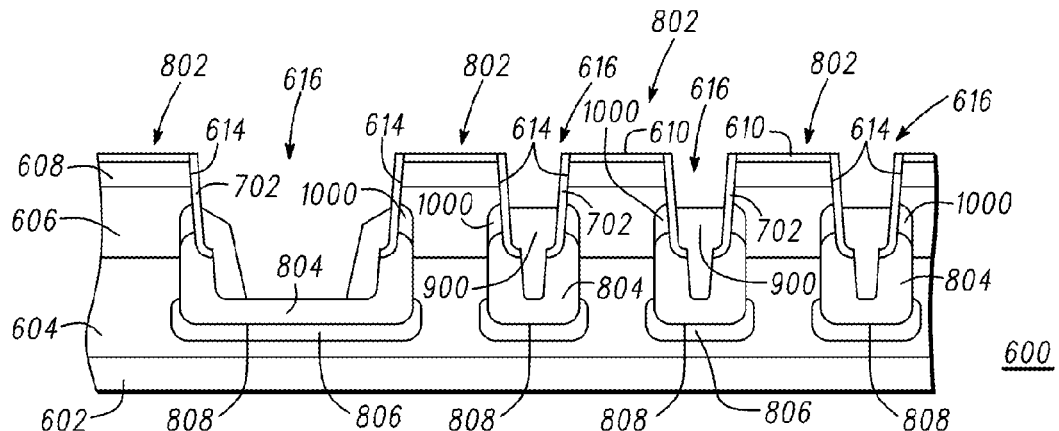
FIG. 10 illustrates the diode at another stage of formation according to an example of the cross-sectional view of p-type regions formed in mesa regions.

FIG. 10 illustrates diode 600 at another stage of formation according to an example of the cross-sectional view of p-type regions 1000 formed in mesa regions 802. In general, a dopant can be placed adjacent to a portion of sidewalls 614 of mesa region 802 to form p-type regions 1000. As mentioned previously, polysilicon 900 can be made conductive by a dopant placed therein. A p-type dopant such as boron can be placed in polysilicon 900. Thus, polysilicon 900 can be a source of the dopant for forming the p-type regions 1000 adjacent to sidewalls 614. In one embodiment, the p-type dopant in polysilicon 900 diffuses into mesa region 802 in a controlled fashion. For example, a timed thermal cycle can control the amount of diffusion of dopant into mesa region 802. The path of diffusion is the polysilicon 900 that overlies silicon dioxide layer 702 overlying sidewalls 614 thereby localizing the dopant at the predetermined distance below the major surface of mesa region 802. In general, dopant diffuses into epitaxial layer 606 forming p-type regions 1000. Subsequent thermal steps in the process flow can increase out diffusion of p-type region 1000 in mesa region 802. P-type regions 1000 can extend into epitaxial layer 608 and epitaxial layer 604. P-type regions 1000 correspond to p-type regions 220 of FIG. 2. P-type regions 1000 can form a p-n diode with epitaxial layers 608, 606, and 604 that may pinch-off or restrict the lateral and vertical current path through mesa region 802 under reverse bias conditions of diode 600. The selection of the characteristics of epitaxial layer 608 can be used to optimize the performance of diode 600 in conjunction with the p-n junction comprising p-type regions 1000.

In the example of the 100 volt diode, p-type regions 1000 are formed in a major portion of epitaxial layer 606 but can also be partially formed in epitaxial layers 608, epitaxial layer 604, or both. The epitaxial layer 606 is approximately 1.0-1.5 microns in depth. P-type regions 1000 have a vertical width of approximately 0.65-0.85 microns in epitaxial layer 606 adjacent to sidewalls 614. P-type regions 1000 extend into mesa region 802 approximately 0.4-0.45 microns from sidewalls 614 of mesa region 802. P-type regions 1000 form a p-n diode with mesa region 802. P-type regions 1000 form a neck that reduces the vertical current path within mesa region 802 by 0.80-0.90 microns. The current path is further reduced by the space charge region of the p-n junction as disclosed herein.

Figure 11:
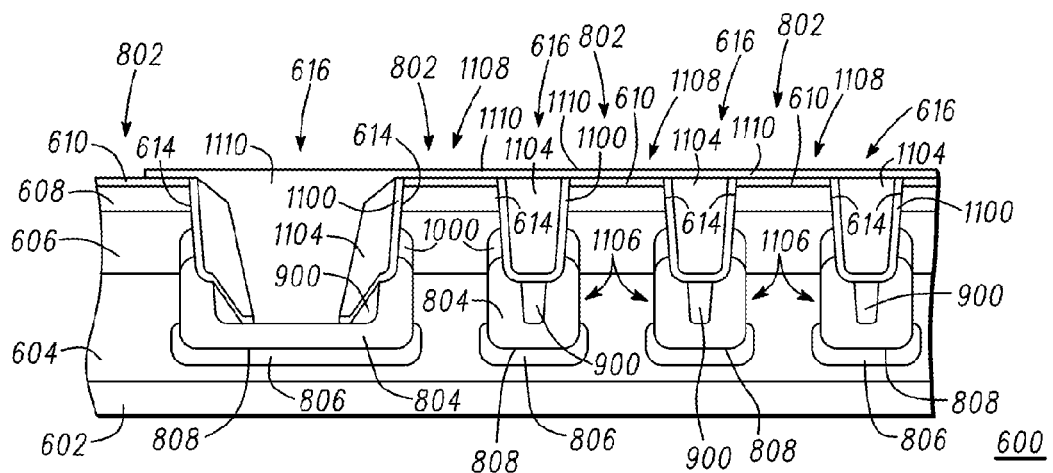
FIG. 11 illustrates the diode at another stage of formation according to an example of the cross-sectional view of Schottky diodes being formed.

FIG. 11 illustrates diode 600 at another stage of formation according to an example of the cross-sectional view of Schottky diodes being formed. In general, an insulating layer is removed on a portion of sidewalls 614 that exposes mesa region 802. A barrier metal 1100 can be placed on the exposed portion of sidewalls 614 to form Schottky diodes. The barrier metal 1100 also couples to p-type regions 1000 and polysilicon 900. Prior to the placement of barrier metal 1100, a polysilicon recess etch can be performed that removes some polysilicon or all of the polysilicon 900 in trenches 616. The recess etch increases a distance of the major surface of polysilicon 900 in trenches 616 from the major surface of mesa regions 802. In one embodiment, the recess etch leaves polysilicon 900 overlying silicon dioxide layer 804 and overlying a portion of silicon dioxide layer 702. Although disclosed herein that the polysilicon 900 includes a boron dopant, the polysilicon 900 can also be a phosphorous-doped polysilicon.

An insulating layer can be removed on a portion of sidewalls 614 to expose mesa region 802. In one embodiment, a sidewall silicon dioxide wet strip removes silicon dioxide layer 702. A conductive material is then placed on the exposed portion of sidewalls 614 and to fill in areas where silicon dioxide layer 702 was removed. In one embodiment, the conductive material is barrier metal 1100 that can be formed on the sidewalls 614 of mesa regions 802. Schottky diodes are formed with the barrier metal 1100 as an anode and mesa region 802 as the cathode. The barrier metal 1100 can overlie epitaxial layer 608 or epitaxial layers 608 and 606 on sidewalls 614. The barrier metal 1100 may overlie and couple to p-type regions 1000. The Schottky diodes correspond to Schottky diodes 212 of FIG. 2.

In the example of the 100 volt diode, the cathode of the Schottky diodes is primarily formed in epitaxial layer 608 of mesa region 802 but can also be formed in a portion of epitaxial layer 606. The epitaxial layer 608 has an n-type doping concentration of $4.0\ e^{15}/cm^3\text{-}1.0\ e^{16}/cm^3$. In one embodiment, the Schottky diodes are formed below the major surface of mesa region 802 and are bounded by p-type regions 1000.

In general, diode 600 comprises the Schottky diodes in parallel with the p-n diodes formed by p-type regions 1000 and epitaxial layer 606. As illustrated, the Schottky diodes are formed on sidewalls 614 adjacent to the major surface of mesa regions 802. The width of a Schottky diode is defined by the barrier metal contact area between the major surface and p-type regions 1000. In the example of the 100 volt diode, the width of the barrier metal 1100 is approximately 0.5-1.4 microns. The active area of the Schottky diode on each sidewall 614 is the width times the length of the Schottky barrier metal contact area on each mesa region 802. The length is selected for the current carrying requirement of the application. An example of barrier metals used to form the Schottky diodes are Cr, Ti, Ni, Pt, W, Ta, Co, and Hf to name but a few that form a silicide with silicon each having different barrier heights.

A conductive material is placed in trenches 616. In one embodiment, tungsten is placed in trenches 616 to form tungsten plugs 1104. A material removal step or planarization step can be used to remove tungsten material such that a major surface of tungsten plugs 1104 is approximately planar to the major surface of the die. The conductive materials comprising tungsten plugs 1104, barrier metal 1100, p-type regions 1000, and polysilicon 900 are coupled in common. In the example, p-type regions 806 are left floating. Alternatively, p-type regions 806 can be coupled to the anode of diode 600.

MOS structures 1106 are formed adjacent to sidewalls 614 comprising polysilicon 900, silicon dioxide layer 804 and mesa region 802 that respectively are the gate, insulating layer, and substrate of the device. The gate of MOS structures 1106 are coupled to the anode of diode 600. The MOS structures 1106 correspond to MOS structures 230 of FIG. 2. MOS structures 1106 are bounded by p-type regions 1000 and p-type regions 806. In one embodiment, the gate width of MOS structures 1106 the distance between p-type region 1000 and 806 on sidewalls 614. The substrate of MOS structures 1106 comprises epitaxial layer 606, epitaxial layer 604, or both. In the example of the 100 volt diode, the epitaxial layer 606 has an n-type doping concentration of approximately 1.0-2.0 $e^{15}/cm^3$ and the epitaxial layer 604 has a doping concentration of approximately 2.5-4.5 $e^{15}/cm^3$. Epitaxial layers 606 and 604 support an enhancement region being formed in epitaxial layer 606 when diode 600 is forward biased. Conversely, epitaxial layers 606 and 604 support a depletion region being formed in the substrate of MOS structures 1106 when diode 600 is reverse biased.

A conductive material is formed overlying the insulating layer on the major surface of mesa regions 802. In one embodiment, the conductive material is formed on silicon dioxide layer 610. The conductive material can be patterned to form a conductive layer 1110. The conductive layer 1110 can be doped polysilicon, silicide, or metal. The conductive layer 1110 is the gate of a MOS structure 1108. MOS structure 1108 is formed overlying the major surface of mesa regions 802 and comprises conductive layer 1110, silicon dioxide layer 610 and mesa region 802 that respectively are the gate, insulating layer, and substrate of the device. In one embodiment, the conductive layer 1110 is coupled to the anode of diode 600 and tungsten plugs 1104 by a subsequent conductive layer or layers. The MOS structure 1108 corresponds to the MOS structure 214 described in FIG. 2.

In the example, the substrate of MOS structure 1108 is epitaxial layer 608 of mesa region 802. In the example, the epitaxial layer 608 has an n-type doping concentration of approximately 4.0 $e^{15}/cm^3$-1.0 $e^{16}/cm^3$. The width of the gate of MOS structure 1108 is approximately 1.5-3.0 microns that corresponds to the width of mesa region 802. The doping concentration supports an enhancement region being formed in epitaxial layer 608 when diode 600 is forward biased. Conversely, a depletion region can be formed in epitaxial layer 608 when diode 600 is reverse biased. The MOS structure 1108 improves performance of diode 600 in both forward and reverse bias operation.

Thus, a device manufacturing process is disclosed that utilizes few masking and processing steps that creates the device structure for diode 600. The diode 600 comprises a Schottky diode and a p-n diode in parallel. The Schottky diode and the p-n diode are formed in the sidewalls 614 of mesa regions 802. The Schottky diode carries a majority of the current under forward biased conditions at low to mid current levels of the application whereby the p-n diode increasingly carries a portion of the current at higher current levels. The low forward voltage drop of the Schottky diode reduces power dissipation of diode 600. The MOS structures 1106 and 1108 form enhancement regions when diode 600 is forward biased. The enhancement regions of MOS structures 1106 and 1108 lower the resistivity of the current path thereby improving device efficiency.

Diode 600 under reverse bias conditions generates four pinch-off regions that constrict the lateral and vertical current path in mesa region 802. The pinch-off regions reduce the leakage current of diode 600. The diode 600 can also be formed having fewer or more pinch-off regions within mesa region 802 using the methodology disclosed herein. Similarly, the diode 600 can also be formed having more or less devices that reduce the resistivity of the current paths under forward bias operation using the methodology disclosed herein.

Figure 12:
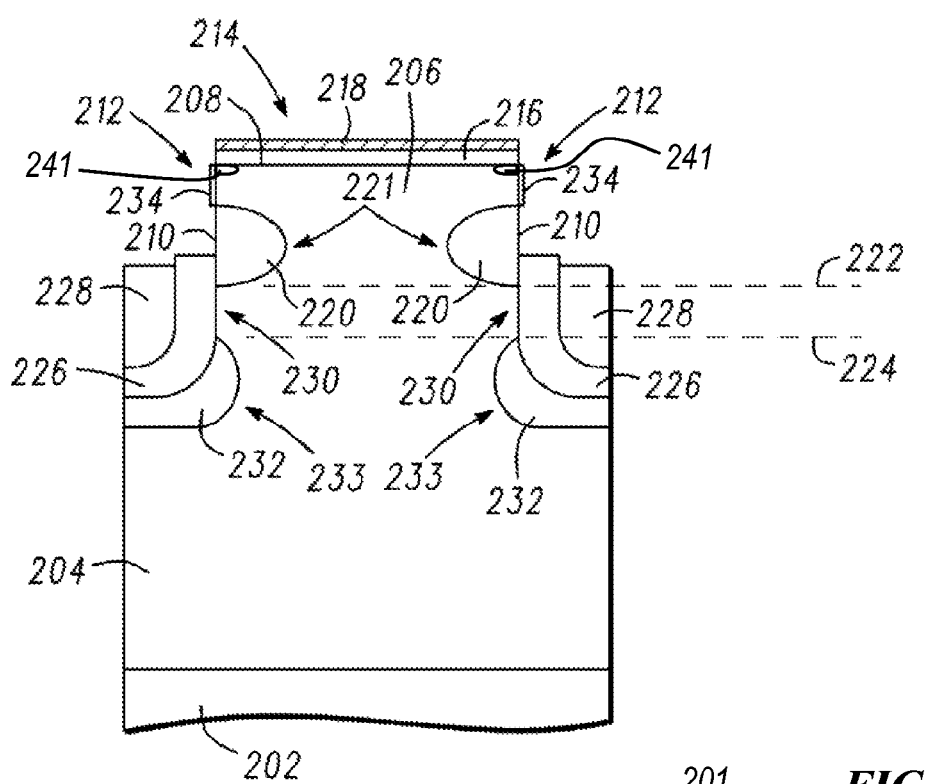
FIG. 12 illustrates a partial cross-sectional view of a diode in accordance with another example embodiment.

FIG. 12 illustrates a partial cross-sectional view of a diode 201 in accordance with another example embodiment. Diode 201 is similar to diode 200 illustrated in FIGS. 2 through 5, and only the differences will be described hereinafter. More particularly, diode 201 further comprises a doped ring structure 241, p-type doped ring structure 241, or p-type regions 241 disposed in n-type mesa region 206 adjacent or proximate to major surface 208 and adjoining a peripheral portion of Schottky diodes 212. In accordance with the present embodiment, p-type regions 241 are configured to form p-n diode structures with n-type mesa region 241. In one embodiment, p-type regions 241 adjoin the peripheral portions of Schottky diodes 212 that adjoin major surface 208. In one embodiment, p-type regions 241 are disposed around the top edge or corner of n-type mesa region 206 and adjoin a portion of barrier metal 234 of Schottky diodes 212. In one embodiment, p-type regions 241 are disposed in n-type mesa region 206 adjoining corner regions or portions defined by major surface 208 and upper sidewall surfaces of sidewalls 210. P-type regions 241 and p-type regions 220 are vertically spaced apart such that a portion of n-type mesa region 206 is disposed between p-type regions 241 and p-type regions 220. In accordance with the present embodiment, p-type regions 241 are configured to provide enhanced termination and reduced leakage for diode 201. P-type regions 214 have a dopant concentration suitable for use as a Schottky guard ring structure. In some embodiments, p-type regions 241 have a dopant concentration proximate to the trench sidewall surfaces of n-type mesa region 206 less than about $1.0 \times 10^{17}$ atoms/cm$^3$.

In one embodiment, p-type regions 241 are formed using angled ion implantation and anneal steps. In one example method with reference to FIGS. 7-9, silicon nitride layer 704 can be removed leaving all or a sufficient portion of silicon nitride layer 612 in place over epitaxial layer 608. Polysilicon 900 can then be formed within the trenches and partially etched back to expose the upper portions of sidewalls 614 at a predetermined depth. P-type regions 241 can be then formed using angled ion implantation through silicon dioxide 702 using the partially etched-back polysilicon 900 and silicon nitride layer 612 as masks. Thereafter, polysilicon 900 can be etched back further to its intended depth and silicon nitride layer 612 can be removed. The implanted dopant can be annealed at a selected step to form p-type regions 241. In other embodiments, other dopant techniques may be used.

Thus, the description of the invention is merely exemplary in nature and, thus, variations that do not depart from the gist of the invention are intended to be within the scope of the

What is claimed is:

1. A semiconductor device comprising:
a semiconductor region of a first conductivity type;
a trench extending from a first major surface of the semiconductor region;
a first dielectric layer at least along lower sidewall surfaces of the trench, but not along upper sidewall surfaces of the trench;
a first conductive layer disposed on at least a portion of upper sidewall surfaces of the trench;
a second conductive layer disposed in the trench overlying at least portions of the first dielectric layer;
a gate dielectric layer overlying the first major surface;
a third conductive layer overlying the gate dielectric layer;
a first doped region of a second conductivity type adjacent the trench and spaced apart from the major surface, wherein:
the first conductive layer is configured as a first electrode of a Schottky diode structure, and wherein at least a portion of the semiconductor region adjacent the first conductive layer is configured as a second electrode of the Schottky diode structure;
the semiconductor region, the gate dielectric layer, and the third conductive layer are configured as a first MOS structure; and
the first doped region and the semiconductor region are configured as a first diode structure; and
a second doped region of the second conductivity type disposed in the semiconductor region adjoining corner regions defined by the first major surface and the upper sidewall surfaces, wherein the second doped region and the semiconductor region are configured as a second diode structure.

2. The semiconductor device of claim 1, wherein:
the semiconductor region, the first dielectric layer and the second conductive layer are configured as a second MOS structure;
the Schottky diode structure is between the first MOS structure and the first diode structure; and
the first diode structure is between the Schottky diode structure and the second MOS structure.

3. The semiconductor device of claim 2, wherein the first conductive layer, the second conductive layer, and the third conductive layer are electrically coupled together.

4. The semiconductor device of claim 3 further comprising a third doped region of the second conductivity type adjacent lower surfaces of the trench, wherein the third doped region and the semiconductor region are configured as a third diode structure.

5. The semiconductor device of claim 1, wherein the semiconductor region comprises:
a first region adjacent the major surface and the Schottky diode structure, the first region having a first doping concentration;
a second region adjacent a lower portion of the first region, the second region having a second doping concentration; and
a third region adjacent a lower portion of the second region, the third region having a third doping concentration, wherein one or more of the first, second, and third doping concentrations are different from each other.

6. The semiconductor device of claim 5, wherein the second doping concentration is less than the third doping concentration and the first doping concentration is greater than the third doping concentration.

7. The semiconductor device of claim 1, wherein the gate dielectric layer has thickness of about 0.1 microns to about 0.2 microns.

8. The semiconductor device of claim 1, wherein the trench extends to a depth of about 1.0 microns to about 2.0 microns from the first major surface.

9. The semiconductor device of claim 1, wherein the semiconductor region is uniformly doped.

10. The semiconductor device of claim 1, wherein the semiconductor region is non-uniformly doped.

11. A semiconductor device comprising:
a substrate of a first conductivity type;
a mesa region of the first conductivity type formed in or overlying the substrate, the mesa region having a major surface and a sidewall;
a Schottky diode comprising an anode and a cathode, where the anode of the Schottky diode overlies a first portion of the sidewall of the mesa region, and where the cathode of the Schottky diode comprises the mesa region, and where the Schottky diode further includes a first doped region of a second conductivity type disposed adjoining a portion of the anode and in a portion of the mesa region where the sidewall of the mesa region adjoins the major surface;
a first MOS structure overlying the major surface of the mesa region; and
a second MOS structure overlying a second portion of the sidewall of the mesa region, where the second MOS structure is formed at a first predetermined distance below the major surface of the mesa.

12. The device of claim 11 further including a first diode comprising a second doped region of the second conductivity type a second predetermined distance from the major surface of the mesa region and adjacent to the sidewall of the mesa region, and where the second doped region is coupled to the anode of the Schottky diode, and where the second doped region and the first doped region are spaced apart with a portion of the mesa region disposed between the first doped region and the second doped region.

13. The device of claim 12, where:
the first MOS structure comprises a first gate electrode;
the second MOS structure comprises a second gate electrode; and
the first gate electrode and the second gate electrode are electrically coupled to the anode of the Schottky diode.

14. The device of claim 13 further including a second diode comprising a third doped region of the second conductivity type a third predetermined distance from the major surface of the mesa region and adjacent to the sidewall of the mesa region where the second predetermined distance is above the first predetermined distance and where the first predetermined distance is above the third predetermined distance.

15. A semiconductor device comprising:

a semiconductor region of a first conductivity type;

a first trench extending from a first major surface of the semiconductor region;

a second trench extending from the first major surface and spaced apart from the first trench to provide a mesa region between the first trench and the second trench;

a first dielectric layer at least along lower sidewall surfaces of the mesa region, but not along upper sidewall surfaces of the mesa region;

a first conductive layer disposed on at least a portion of the upper sidewall surfaces of the mesa region;

a gate dielectric layer overlying the first major surface;

a second conductive layer overlying the gate dielectric layer and electrically coupled to the first conductive layer;

a first doped region of a second conductivity type within the mesa region and spaced apart from the major surface, wherein:

the first conductive layer is configured as a first electrode of a Schottky diode structure, and wherein at least a portion of the mesa region adjacent the first conductive layer is configured as a second electrode of the Schottky diode structure;

the mesa region, the gate dielectric layer, and the second conductive layer are configured as a first MOS structure; and the first doped region and the mesa region are configured as a first diode structure; and a second doped region of the second conductivity type disposed in the semiconductor region adjoining corner regions defined by the first major surface and the upper sidewall surfaces, where the first doped region and the second doped region are spaced apart with a portion of the semiconductor region disposed between the first doped region and the second doped region, and where the second doped region and the mesa region are configured as a second diode structure.

16. The semiconductor device of claim 15, further comprising a third conductive layer disposed on the first dielectric layer, wherein:

the mesa region, the first dielectric layer and the third conductive layer are configured as a second MOS structure;

the Schottky diode structure is between the first MOS structure and the first diode structure; and the first diode structure is between the Schottky diode structure and the second MOS structure.

17. The semiconductor device of claim 16, wherein the first conductive layer, the second conductive layer, and the third conductive layer are electrically coupled together.

18. The semiconductor device of claim 17 further comprising a third doped region of the second conductivity type adjacent lower surfaces of the mesa region, wherein the third doped region and the mesa region are configured as a third diode structure.

19. The semiconductor device of claim 15, wherein the semiconductor device is configured as a means for coupling a regulated voltage to a load in a first mode of operation, and wherein the semiconductor device is configured as a means for isolating the regulated voltage from the load in a second mode of operation.

20. The semiconductor device of claim 15, wherein the semiconductor region is non-uniformly doped.

* * * * *